United States Patent
Hamada

(10) Patent No.: US 10,962,877 B2
(45) Date of Patent: Mar. 30, 2021

(54) METHOD OF SEPARATING PELLICLE AND DEVICE FOR SEPARATING PELLICLE

(71) Applicant: Shin-Etsu Chemical Co., Ltd., Tokyo (JP)

(72) Inventor: Yuichi Hamada, Gunma-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 16/664,173

(22) Filed: Oct. 25, 2019

(65) Prior Publication Data
US 2020/0133116 A1 Apr. 30, 2020

(30) Foreign Application Priority Data
Oct. 26, 2018 (JP) .............................. JP2018-201420

(51) Int. Cl.
*B32B 43/00* (2006.01)
*G03F 1/62* (2012.01)
*G03F 7/20* (2006.01)
*B32B 38/10* (2006.01)

(52) U.S. Cl.
CPC .............. *G03F 1/62* (2013.01); *G03F 7/7015* (2013.01); *B32B 38/10* (2013.01); *B32B 43/006* (2013.01)

(58) Field of Classification Search
CPC . B32B 38/10; B32B 43/006; Y10T 156/1179; Y10T 156/1983
See application file for complete search history.

(56) References Cited

U.S. PATENT DOCUMENTS

| | | | | |
|---|---|---|---|---|
| 4,859,269 A | * | 8/1989 | Nishiguchi | .......... H05K 13/021 156/361 |
| 5,976,307 A | | 11/1999 | Cook | |
| 6,201,306 B1 | * | 3/2001 | Kurosawa | ......... H01L 21/67144 228/102 |

(Continued)

FOREIGN PATENT DOCUMENTS

| | | |
|---|---|---|
| EP | 0942325 A2 | 9/1999 |
| EP | 2592123 B1 | 2/2020 |

(Continued)

OTHER PUBLICATIONS

Extended EP search report in corresponding EP19203986 dated Mar. 17, 2020 (pp. 1-19).

*Primary Examiner* — Mark A Osele
*Assistant Examiner* — Nickolas R Harm
(74) *Attorney, Agent, or Firm* — Millen, White, Zelano & Branigan, PC; Ryan Pool

(57) ABSTRACT

To provide a method of separating a pellicle and a device for separating a pellicle which can reduce the amount of residue left on an exposure original plate when the pellicle is separated from the exposure original plate and which can wash again the exposure original plate under mitigated washing conditions, a pellicle frame support pin is inserted into a jig hole provided in an outer surface of the pellicle frame, the pellicle frame support pin is moved in a direction in which the pellicle is separated from the exposure original plate, a separation force applied by the movement to the pellicle frame support pin is measured and the pellicle is separated from the exposure original plate while control is being performed such that the separation force is minimized.

10 Claims, 3 Drawing Sheets

(56) References Cited

U.S. PATENT DOCUMENTS

| | | | | |
|---|---|---|---|---|
| 6,765,645 B1* | 7/2004 | Lee | ................... | G03F 7/70983 |
| | | | | 355/30 |
| 6,884,319 B2* | 4/2005 | Kim | ................... | C23C 16/4581 |
| | | | | 118/725 |
| 7,292,428 B2* | 11/2007 | Hanawa | .............. | H01L 21/6831 |
| | | | | 361/234 |
| 8,153,334 B2 | 4/2012 | Hamada | | |
| 8,673,166 B2* | 3/2014 | Okita | ................ | H01J 37/32431 |
| | | | | 118/723 R |
| 8,945,799 B2 | 2/2015 | Taneichi et al. | | |
| 2008/0318346 A1* | 12/2008 | Maki | ................... | H01L 21/6835 |
| | | | | 438/7 |
| 2009/0286168 A1* | 11/2009 | Hamada | .................. | G03F 1/64 |
| | | | | 430/5 |
| 2017/0192349 A1* | 7/2017 | Kohmura | .................. | G03F 1/62 |

FOREIGN PATENT DOCUMENTS

| | | |
|---|---|---|
| JP | 2009301022 A | 12/2009 |
| WO | 05003863 A2 | 1/2005 |

\* cited by examiner

METHOD OF SEPARATING PELLICLE AND DEVICE FOR SEPARATING PELLICLE

FIELD OF THE INVENTION

The present invention relates to a method of separating a pellicle which is used as a dust fender for a lithography mask when a semiconductor device such as LSI, VLSI or the like or a liquid crystal display board is manufactured and to a device for separating the pellicle.

BACKGROUND TECHNOLOGY

In manufacturing semiconductor such as LSI, VLSI or the like, or in manufacturing a liquid crystal display board or the like, an exposure original plate is overlaid on a resist coated surface of a semiconductor wafer or a liquid crystal substrate, and a latent image pattern is formed on the resist by irradiating collimated light. At this time, when dust is adhered to the exposure original plate, the dust absorbs or bents the light causing deformation of a transferred pattern, roughen edges and black stains on a base, with the result that dimensions, quality, appearance and the like are disadvantageously degraded. It is noted that in the present invention, the "exposure original plate" collectively refers to a lithography mask and a reticle.

Hence, although a lithography operation is generally performed in a clean room, since it is difficult to constantly keep the exposure original plate clean, a method is adopted of adhering a pellicle which includes a pellicle film that is used as a dust fender on the pattern surface of the exposure original plate and that fully passes through the exposure light.

The pellicle is a dustproof protective cover for an exposure original plate which includes a pellicle frame (frame member), a pellicle film which is provided in a tensioned state on the upper end surface of the pellicle frame, an adhesive layer which is provided on the lower end surface of the pellicle frame and a liner which is intended for the protection of the adhesive layer, and the adhesive layer is stuck to the pattern surface of the exposure original plate.

When the pellicle is stuck to the pattern surface of the exposure original plate, the pellicle is located so as to surround a pattern region, and the pattern region and the outside of the pellicle are separated in the direction of thickness such that dust outside the pellicle is prevented from being adhered, with the result that the dust is not directly adhered on the surface of the exposure original plate but is adhered on the pellicle film. The dust on the pellicle film is not related to transfer as long as a focal point is located on the pattern of the exposure original plate at the time of lithography.

The pellicle is generally stuck to the exposure original plate with a dedicated device or a jig. In any device, a basic operation is the same, and a mutual position relationship between the pellicle and the exposure original plate is adjusted, the pellicle frame is thereafter pressurized parallel to the exposure original plate for a fixed time and thus the pellicle is stuck.

Incidentally, in recent years, as in the design rule of LSI, line widths have been progressively refined to a sub-quarter micron, wavelengths in exposure light sources have been progressively reduced. Specifically, the emission spectra of mercury lamps such as a g-line (436 nm) and an i-line (365 nm) which have so far been the mainstream are being shifted to KrF excimer laser (248 nm), ArF excimer laser (193 nm), $F_2$ laser (157 nm) and the like. As a result of line widths being progressively reduced, an allowable size of a foreign substance and a haze (Haze: diffusion cloud value) that may occur on the pattern surface of an exposure original plate to which a pellicle is stuck is reduced.

As a film of a mask substrate which has been used in recent years, in order to cope with the refinement of the design rule, a phase-shifting film generally tends to be adopted in a phase-shifting mask (PSM: Phase-Shifting Mask). The phase-shifting film is significantly delicate, and thus the phase-shifting film may be damaged by excessive mask washing. It is noted that the phase-shifting mask is an exposure original plate in which, by addition of the phase-shifting film, the phase and transmittance of light passing through the phase-shifting film are controlled so as to improve a resolution and a depth of focus (DOF: Depth of Focus) at the time of exposure of a wafer and in which thus a transfer property is enhanced.

When a foreign substance or a haze occurs or a pellicle film is damaged for any reason, if a pellicle after being stuck to an exposure original plate needs to be replaced, the pellicle needs to be separated. Then, an operation called re-pellicle is needed in which the exposure original plate where the pellicle is separated is washed again, and in which a new pellicle is stuck.

In the separation of the pellicle, a method of carefully separating the pellicle while holding the pellicle with a hand has been mainly performed. Disadvantageously, however, there is a great danger that a photomask is damaged, and workability is significantly poor.

Hence, as a method of separating the pellicle with a separation jig, a method is proposed in which a pin-shaped separation jig is inserted into a round hole provided in a outer surface of a pellicle frame so as to lift the pellicle frame, and in which thus the pellicle is separated (IP Publication 1).

PRIOR ART PUBLICATION

IP Publication

[IP Publication 1]
Japanese Unexamined Patent Application Publication No. 2009-301022

SUMMARY OF THE INVENTION

Problems the Invention Seeks to Solve

It is most important that in the re-pellicle, the exposure original plate is washed again with high cleanness. As described previously, the phase-shifting film is significantly delicate, and thus the phase-shifting film may be damaged by excessive mask washing. Hence, there is a tendency that a chemical solution which is used in the mask washing is reviewed and that the washing conditions are mitigated. In order to wash again the exposure original plate under mitigated washing conditions, it is important how the amount of residue left on the exposure original plate when the pellicle is separated is reduced.

In the conventional method of separating the pellicle with the separation jig described above, a force beyond an adhesive force is applied between the exposure original plate and the adhesive layer so as to forcefully peel off, from the surface of the exposure original plate, the pellicle including the adhesive layer, and thus a large amount of residue of the adhesive layer is left on the exposure original plate, with the result that it is troublesome to perform the subsequent washing. When the pellicle is separated from the top of the exposure original plate, it is likely that the adhesive layer is displaced so as to stick to the pattern of the exposure original plate, and that thus the pattern is damaged or contaminated. Furthermore, in a large-sized pellicle in which the lengths of sides of the pellicle are long, since the entire pellicle cannot be separated in a stroke, the pellicle needs to be separated part by part, and thus it is necessary to perform such separation that the previously separated part is prevented from being adhered again, with the result that workability is poor.

Hence, the present invention is made in view of the foregoing points, and an object of the present invention is to provide a method of separating a pellicle and a device for separating a pellicle which can reduce the amount of residue left on an exposure original plate when the pellicle is separated from the exposure original plate and which can wash again the exposure original plate under mitigated washing conditions.

Means to Solve the Problems

According to the present invention, there is provided a method of separating, from an exposure original plate, a pellicle which includes a pellicle film that is provided in a tensioned state on an end surface of a pellicle frame through a pellicle film adhesive and an adhesive layer that is provided on the other end surface and in which the adhesive layer is adhered to the exposure original plate, and a pellicle frame support pin is inserted into a jig hole provided in an outer surface of the pellicle frame, the pellicle frame support pin is moved in a direction in which the pellicle is separated from the exposure original plate, a separation force applied by the movement to the pellicle frame support pin is measured and the pellicle is separated from the exposure original plate while control is being performed such that the separation force is minimized. The control of the separation force described above is performed while the speed of movement of and the direction of movement of the pellicle frame support pin are being adjusted.

In the method of separating the pellicle described above, the measurement and the control of the separation force applied to the pellicle frame support pin inserted into the jig hole in the outer surface of the pellicle frame may be collectively performed on the pellicle frame support pins inserted in the jig holes of the same side in the outer surface.

In the method of separating the pellicle described above, the measurement and the control of the separation force applied to the pellicle frame support pin inserted into the jig hole in the outer surface of the pellicle frame can be independently performed on each of the pellicle frame support pins.

In the method of separating the pellicle described above, when the control of the separation force is performed, the pellicle may be separated while the pellicle frame support pin is being made to perform an operation different from the direction in which the pellicle is separated.

On the other hand, according to the present invention, there is provided a device for separating, from an exposure original plate, a pellicle which includes a pellicle film that is provided in a tensioned state on an end surface of a pellicle frame through a pellicle film adhesive and an adhesive layer that is provided on the other end surface and in which the adhesive layer is adhered to the exposure original plate, and the device includes: a plurality of pellicle frame support pins which are inserted into jig holes provided in an outer surface of the pellicle frame so as to support the pellicle frame; a plurality of load cells which are provided so as to respectively correspond to the pellicle frame support pins and which measure forces applied to the corresponding pellicle frame support pins; and a plurality of single axis robots which are provided so as to respectively correspond to the pellicle frame support pins and which independently move the corresponding pellicle frame support pins in an up/down direction. In the separation device described above, a computer may be provided which receives measurement values output by the load cells so as to control servo motors within the single axis robots.

Effects of the Invention

According to the present invention, it is possible to provide a method of separating a pellicle and a device for separating a pellicle which can reduce the amount of residue left on an exposure original plate when the pellicle is separated from the exposure original plate and which can wash again the exposure original plate under mitigated washing conditions.

EXAMPLES TO EMBODY THE INVENTION

An embodiment of the present invention will be described below with reference to drawings. An outline of a pellicle will first be described, and then a device for separating the pellicle and a method of separating the pellicle according to the present invention will be described.

Figure 1:
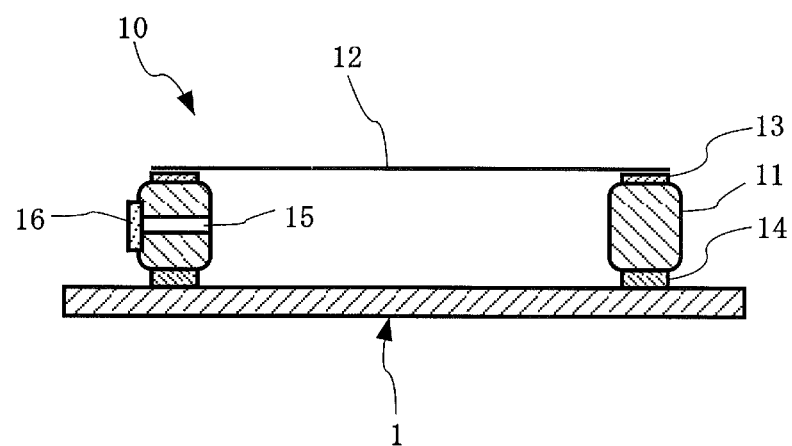
FIG. 1
A vertical cross-sectional view showing a state where a lithography pellicle is stuck to an exposure original plate.

The basic configuration of the pellicle which is used in the present invention will first be described with reference to FIG. 1. FIG. 1 is a vertical cross-sectional view showing a state where a lithography pellicle 10 is stuck to an exposure original plate 1.

In FIG. 1, the exposure original plate 1 is a semiconductor wafer, a mask substrate such as a liquid crystal substrate or a reticle. The pellicle 10 is overlaid on the pattern surface of the exposure original plate 1 coated with a photosensitive resist, and a pellicle film 12 prevents dust from being adhered to the pattern surface when a latent image pattern is formed on the pattern surface by irradiating collimated light.

The pellicle 10 includes: a pellicle frame (frame member) 11; the pellicle film 12 which is provided in a tensioned state on one end surface (in FIG. 1, an upper surface portion) of the pellicle frame 11 through a pellicle film adhesive 13 so as to close a frame opening; an adhesive layer 14 which is provided on the other end surface (in FIG. 1, a lower surface portion) of the pellicle frame 11 and which is fitted to the pattern surface of the exposure original plate 1 such that the adhesive layer 14 can be separated therefrom; and a liner (unillustrated) which is stuck to the lower end surface of the adhesive layer 14 such that the liner can be separated therefrom.

Figure 2:
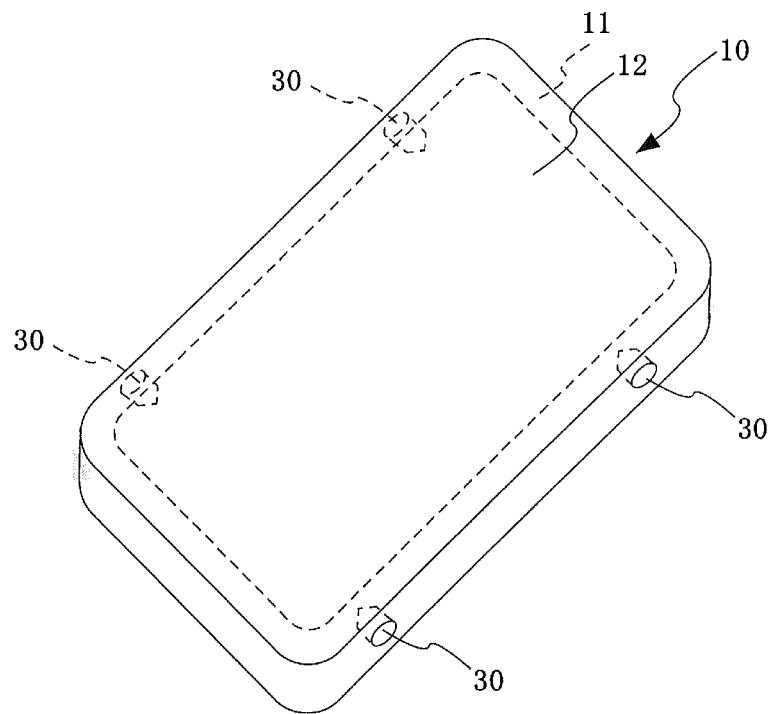
FIG. 2
A perspective view of the pellicle.

FIG. 2 is a perspective view of the pellicle 10.

The pellicle frame 11 that is subjected to flattening processing is preferably used so as to reduce influences such as the distortion of the exposure original plate 1 to which the pellicle frame 11 is stuck, to reduce a residual stress caused by the sticking of the pellicle and to be unlikely to be deformed when stuck to the pellicle. The pellicle frame 11 is molded into a required size and a required frame shape such that the one surface (in FIG. 1, the upper end surface) and the other surface (in FIG. 1, the lower end surface) are parallel to each other, then the one surface and the other surface are subjected to precise flattening processing as necessary and the pellicle frame 11 is provided so as to have ultraprecise parallelism. As shown in FIG. 2, the pellicle frame 11 includes two jig holes 30 in each of the outer surfaces of long side portions on both sides of the pellicle frame 11. In the pellicle frame 11, a barometric pressure adjustment hole (vent) 15 is provided, and a dust removal filter 16 is further provided in order to remove particles.

The size of the pellicle frame 11 is the same as that of a normal pellicle, for example, a pellicle for semiconductor lithography or a pellicle for a lithography step in the manufacturing of a large-sized liquid crystal display board.

In the pellicle frame 11, a known material can be used. In the pellicle frame 11, the material thereof is selected from an aluminum alloy material, stainless steel, polyethylene and the like, and the pellicle frame 11 is molded into a required shape and a requires size. When an aluminum alloy material is used, as long as the strength of the pellicle frame 11 is secured, there is no particular limitation. Preferably, an aluminum alloy is used which is specified by JIS A7075, JIS A6061, JIS A5052 or the like and on which black alumite treatment or the like is performed. A method is preferable in which on the surface of an aluminum alloy material, blast processing is performed with stainless steel, carborundum, glass beads or the like and in which chemical polishing using NaOH or the like is further performed so as to roughen the surface. When a polymer coating is provided on a base material, the surface of the pellicle frame 11 is preferably roughened by sand blast or chemical polishing before the provision of the polymer coating. In the present embodiment, as the method of roughening the surface of the frame described above, a conventional known method can be adopted.

The pellicle film 12 is provided in a tensioned state on the upper surface portion of the pellicle frame 11 through the pellicle film adhesive 13.

In the pellicle film 12, a film material is selected which has light resistance to individual exposure wavelengths in lithography, and a film thickness is designed such that high transmittance can be obtained. On the upper surface portion of the pellicle frame 11, a good solvent for the pellicle film is applied and dried by air such that adhesion is obtained, and thus the pellicle film 12 is provided in a tensioned state or the film is formed previously and separately and is adhered through the pellicle film adhesive 13 such as an acrylic resin, an epoxy resin or a fluorine resin.

The type of pellicle film 12 is not particularly limited, and is selected from nitrocellulose, cellulose acetate, amorphous fluorine polymers and the like which satisfactorily transmit light used in exposure (such as a g-line (436 nm), an i-line (365 nm), KrF excimer laser (248 nm), ArF excimer laser (193 nm) and $F_2$ laser (157 nm)).

Examples of the amorphous fluorine polymer include Cytop (made by Asahi Glass Co., Ltd., product name), Teflon (registered trademark), AF (made by DuPont, product name) and the like. These polymers may be dissolved in a solvent as necessary when the pellicle film is produced so as to be used, and can be dissolved in, for example, a fluorinated solvent as necessary.

The adhesive layer 14 is provided on the lower surface portion of the pellicle frame 11, and is formed of a polybutene resin, a polyvinyl acetate resin, an acrylic resin, a silicone resin or the like. The adhesive layer 14 functions to adhere the pellicle 10 to the exposure original plate 1.

Until the pellicle 10 is fixed to the exposure original plate 1, in order to protect the adhesive layer, the liner (unillustrated) is provided so as to overcoat the adhesive layer 14.

The pellicle 10 configured as described above has the following function.

Specifically, when the pellicle including the pellicle film which is provided in order to prevent dust from being adhered to the pattern surface of the exposure original plate 1 is stuck to the surface of the exposure original plate 1, the pellicle film 12 is located so as to surround a pattern region formed on the surface of the exposure original plate 1, and thus the pattern region and the outside of the pellicle are separated in the direction of thickness such that dust outside the pellicle is prevented from being adhered. When the pellicle 1 is stuck to the surface of the exposure original plate 1, dust is not directly adhered on the surface of the exposure original plate 1 but is adhered on the pellicle film 12. The dust on the pellicle film 12 is not related to transfer as long as a focal point is located on the pattern of the exposure original plate 1 at the time of lithography.

Figure 3:
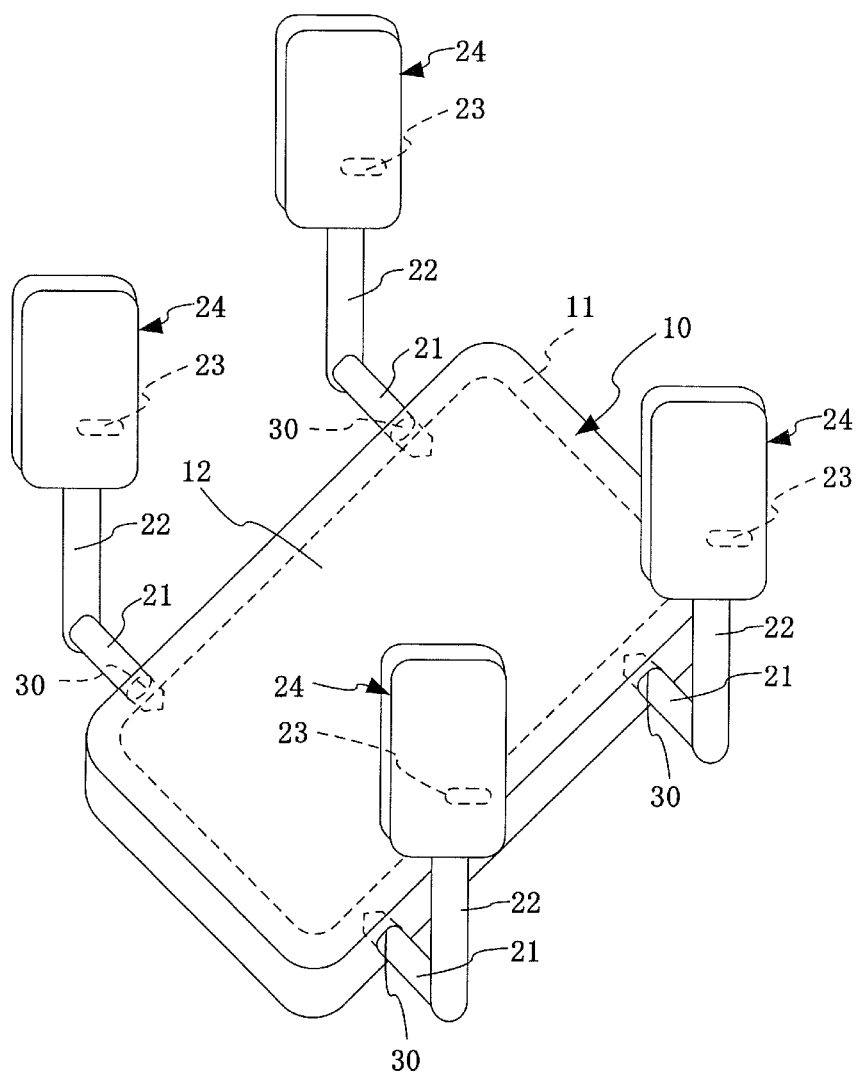
FIG. 3
A schematic perspective view of a device for separating a pellicle according to an embodiment of the present invention.

FIG. 3 is a schematic perspective view of the device 20 for separating the pellicle according to the embodiment of the present invention. The device 20 for separating the pellicle is a device which is used when the method of separating the pellicle according to the present invention is performed.

The device 20 for separating the pellicle includes four pellicle frame support pins 21, four pin support shafts 22, four single axis robots 24 and four load cells 23.

Two pellicle frame support pins 21 are spaced by a required distance in each of the outer surfaces of long sides such that the total of four pellicle frame support pins 21 are provided on both sides, and the four pellicle support pins 21 are provided so that the support pins 21 are individually fitted and coupled into the four jig holes 30 provided in the end surfaces of the pellicle frame 11 on both sides and that the pellicle 10 is separated from the exposure original plate 1 by lifting the pellicle frame 11. The pellicle frame support pin 21 is cylindrical with a conical insertion end part, and in the jig hole 30, an opening portion is a circular hole which corresponds to the cylindrical shape of the pellicle frame support pin 21 and a back portion is a conical hole which corresponds to the conical shape of the pellicle frame support pin 21. Hence, the pellicle frame support pins 21 are fitted into the jig holes 30 without any rattle.

The four pin support shafts 22 are provided such that they integrally support, with their lower end portions, the base end portions of the corresponding pellicle frame support pins 21 and that they can be raised and lowered in an up/down direction.

Figure 4:
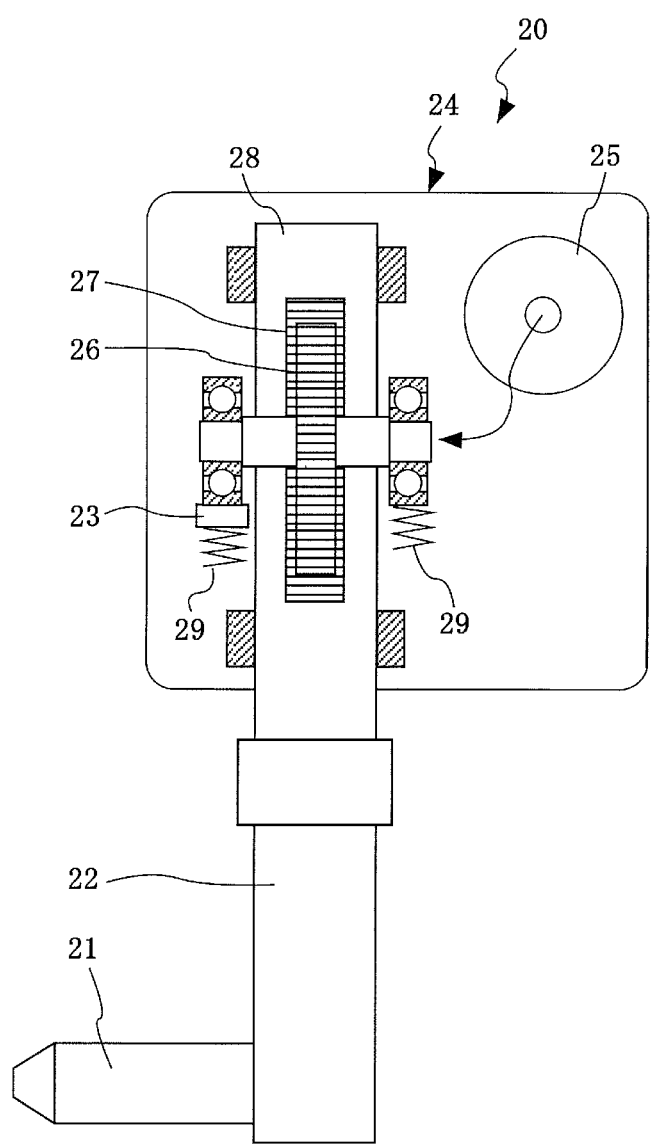
FIG. 4
A schematic view of a single axis robot in the device for separating the pellicle according to the embodiment of the present invention.

FIG. 4 is a schematic view of the single axis robot 24 which forms part of the device 20 for separating the pellicle according to the embodiment of the present invention.

As shown in FIG. 4, each of the four single axis robots 24 includes, for example, within a casing, a servo motor 25 (including a motor driver), a pinion which is rotated by the servo motor 25 and a raising/lowering shaft 28 which includes a rack 27 that engages with the pinion 26 so as to move in an axial direction according to the rotation of the pinion 26, and a lower end portion of the raising/lowering shaft 28 is coupled to the upper end of the pin support shafts 22. Instead of the combination of the servo motor 25, the pinion 26 and the rack 27, a linear actuator can be used or an electrostriction actuator can be selected.

For example, each of the four load cells 23 is provided below one of two bearings for supporting both ends of the support shaft of the pinion in the single axis robot 24 so as to be pressurized by being sandwiched. The other bearing and the load cell 23 are lifted with springs 29. A force applied to the pellicle frame support pin 21 when the servo motor 25 serving as a power source is operated and thus the pellicle frame support pin 21 lifts the pellicle frame 11 is transmitted to the pin support shaft 22, to the rack 27, to the pinion 26 and to the load cell 23 in this order. Hence, it is possible to measure a force which is applied to the pellicle frame support pin 21 when the pellicle frame 11 is lifted, that is, a separation force.

A computer (unillustrated) which controls each of the servo motors 25 receives a measurement value output by the load cell 23, performs A/D conversion thereon, generates a motor drive signal of a predetermined multiple corresponding to the magnitude of a conversion value and outputs the motor drive signal to the motor driver of the corresponding servo motor 25.

In this way, the servo motor 25 can move the pellicle frame support pin 21 in a direction in which the pellicle 10 is separated from the exposure original plate 1 such that the output of the load cell 23 which measures the force applied to the corresponding pellicle frame support pin 21 is minimized.

The method of separating the pellicle according to the embodiment of the present invention will then be described. The separation method is performed with the device for separating the pellicle described above and according to the present invention.

The method of separating the pellicle described above is a method of separating, from the exposure original plate 1, the lithography pellicle 10 which includes the pellicle frame 11, the pellicle film 12 that is provided in a tensioned state on the one end surface (in FIG. 1, the upper surface portion) of the pellicle frame 11 through the pellicle film adhesive 13 and the adhesive layer 14 that is provided on the other end surface (in FIG. 1, the lower surface portion) of the pellicle frame 11 and in which the adhesive layer 14 is adhered to the exposure original plate 1.

In the method of separating the pellicle described above, one pellicle frame support pin 21 for separating the pellicle 10 is inserted into each of the four jig holes 30 provided in both outer surfaces on both sides of the long sides of the pellicle frame 11, the separation force applied to the pellicle frame support pin 21 is measured, while the speed of movement of and the direction of movement of the pellicle frame support pin 21 are being controlled such that the separation force is minimized, the pellicle frame support pin 21 is moved in a direction in which the adhesive layer 14 of the pellicle 10 is separated from the exposure original plate 1 (the direction of separation of the pellicle) and thus the pellicle 10 is separated.

The method of separating the pellicle described above is performed while separation strengths applied to the four pellicle frame support pins 21 inserted into the four jig holes 30 provided in both outer surfaces on both sides of the long sides of the pellicle frame 11 are being measured and controlled individually and independently.

When in the step of separating the pellicle, the pellicle 10 is simultaneously lifted with the four pellicle frame support pins 21 shown in FIG. 3, since the separation of the adhesive layer 14 from the exposure original plate 1 is performed over the entire surface of the adhesive layer 14, and thus influences of the distortion of the exposure original plate 1, the separation residue of the adhesive layer and the like may occur, to perform the method while the separation strengths are being measured and controlled individually and independently is effective for reducing the influences described above.

The device 20 for separating the pellicle includes a stage though the stage is not shown in FIG. 3. The exposure original plate 1 to which the pellicle 10 is stuck is set on the stage with the pellicle 10 thereon. When re-pellicle for sticking a new pellicle is needed, the pellicle frame support pins 21 are inserted into the four jig holes 30 provided in the side surface portions of the pellicle frame 11 on both sides, and a start button (unillustrated) for starting the operation of the device for separating the pellicle is pressed. The four single axis robots 24 are associated with the measurement values of the corresponding load cells 23 so as to individually lift up the pellicle frame support pins and to thereby lift up the pellicle 10, and thus the four single axis robots 24 separate the adhesive layer 14 of the pellicle 10 from the exposure original plate 1 of the pellicle 10.

The reason why the configuration is adopted in which the four parts of the pellicle frame 11 on both sides are supported with the four pellicle frame support pins 21, in which the individual pellicle frame support pins 21 are lifted with the four single axis robots 24 independently and simultaneously such that the measurement values output by the load cells 23 are minimized and in which thus the pellicle frame 11 is lifted can be described as follows.

As described in the discussion of the conventional technology, the pellicle is stuck to the exposure original plate with a dedicated device or a jig, a mutual position relationship between the pellicle and the exposure original plate is adjusted, the pellicle frame 11 is thereafter pressurized parallel to the exposure original plate 1 for a fixed time and thus the adhesive layer 14 of the pellicle 10 is stuck. In this case, it cannot be said that an adhesive force between the exposure original plate 1 and the adhesive layer 14 of the pellicle 10 is uniform. Parts which are easily separated and parts which are not easily separated are randomly present. Hence, when the adhesive layer 14 of the pellicle 10 is separated from the exposure original plate 1 uniformly in all parts, in the parts which are easily separated, measurement values output by the load cells 23 are decreased whereas in the parts which are not easily separated, measurement values output by the load cells 23 are increased. In the parts where the measurement values output by the load cells 23 are increased, a large load caused by the separation force is applied to the adhesive layer 14, and thus the amount of residue left on the exposure original plate is increased.

Hence, when the configuration is adopted in which the four pellicle frame support pins 21 are lifted with the single axis robots 24 independently and simultaneously such that the measurement values output by the load cells 23 are minimized and in which thus the pellicle frame 11 is lifted, since in the parts which are not easily separated, it takes a long separation time such that a large load caused by the separation force is prevented from being applied to the adhesive layer 14, for example, the pellicle frame support pin 21 is lifted at a speed of, for example, 0.1 mm/second such that the measurement value of the load cell 23 is equal to or less than a predetermined set value (threshold value). Consequently, the parts are separated without a large load caused by the separation force being applied to the adhesive layer 14, and thus the amount of residue left on the exposure original plate 1 is reduced.

On the other hand, since in the parts which are easily separated, the measurement value of the load cell 23 is equal to or less than the predetermined set value (threshold value), when as in the parts which are not easily separated, the pellicle frame support pin 21 is lifted at a speed of, for example, 0.1 mm/second, the parts are separated without a large load caused by the separation force being applied to the adhesive layer 14, and thus the amount of residue left on the exposure original plate 1 is reduced.

In this way, the movements of the four single axis robots 24 can be controlled such that the separation force is not unevenly distributed, and when the pellicle 10 is separated from the exposure original plate 1, the amount of residue left on the exposure original plate 1 can be reduced, with the result that it is possible to wash again the exposure original plate under mitigated washing conditions.

Preferably, in the method of separating the pellicle according to the present invention, in order to minimize the separation force when the pellicle is separated from a mask, depending on the situation, an instruction is provided to perform an operation different from the direction of separation of the pellicle, and thus the damage caused by the separation of the adhesive layer 14 is minimized Here, the expression "depending on the situation, an instruction is provided to perform an operation different from the direction of separation of the pellicle" means that, for example, when the measurement value of the load cell exceeds the threshold value in the setting in which the pellicle frame support pin is raised at a speed of, for example, 0.1 mm/second, the raising of the pellicle frame support pin is stopped or is lowered only by a small dimension or the raising speed is lowered.

To independently control the four pellicle frame support pins so as to separate the pellicle is very similar to the movement of separation of the pellicle which is manually made by an operator who is familiar with the pellicle step. In a case where the operator actually and manually uses a separation jig to perform the separation operation, when the separation of part of the pellicle is started, the separation operation generally proceeds more rapidly than the previous movement. In the case of the operator who is familiar with the separation step, the operator receives a phenomenon of the start of the separation through the separation jig as a sensation, and controls the movement of a hand to lessen the separation operation so as to minimize the damage of a pellicle sticky agent.

EXAMPLES

Examples to which the device 20 for separating the pellicle and the method of separating the pellicle according to the present invention are applied will be described below. A "mask" and a "reticle" in the examples and comparative examples are described as examples of the "exposure original plate 1" shown in FIG. 1.

Example 1

The production of a pellicle which was used in example 1 will first be described. A pellicle frame made of an aluminum alloy (outer size 149 mm×115 mm×3.5 mm×wall thickness 2 mm, the flatness of an end surface to be coated with a sticky agent for sticking a mask, 15 um) was accurately washed, then the end surface to be coated with the sticky agent was coated with an acrylic sticky agent (product name: SK-Dyne, SK-1425) made by Soken Chemical & Engineering Co., Ltd. and was left at room temperature for 60 minutes so as to provide the sticky agent, thereafter a separator was placed on an upper surface portion (whose flatness was 5 um) of an aluminum plate which was larger than the pellicle frame and the pellicle frame coated with the sticky agent described above was placed with the sticky agent facing downward. In this way, the sticky agent was brought into contact with the flat separator so as to be subjected to flattening processing. Then, the pellicle frame on the aluminum plate was put into an oven of 60° C. for 60 minutes such that the sticky agent was cured, thereafter the pellicle was removed together with the aluminum plate and the pellicle frame on which the sticky agent was formed was separated from the separator on the side of the aluminum plate. Then, an end surface on the side opposite to the surface of the pellicle frame coated with the sticky agent was coated with an adhesive (product name: CYTOP CTX-A) made by Asahi Glass Co., Ltd., thereafter the pellicle frame was heated at 130° C. such that the adhesive was cured so as to be brought into a state where the adhesion ability was exhibited and finally, the adhesive coated end surface of the pellicle frame described above was stuck to a pellicle film which was formed and overlaid so as to correspond to an aluminum frame slightly larger than the pellicle frame, with the result that the part outside the pellicle frame was removed. Hence, the pellicle was completed.

Then, a 6025 mask substrate and the completed pellicle described above were set on the stage of a pressurization device according to the present embodiment, and were pressurized with a sticking load of 100N (the set load was reached for 60 seconds) for a load time of 30 seconds, and the pellicle was stuck to the mask substrate and was left at room temperature for 7 days.

After 7 days, the mask substrate to which the pellicle was fitted was set on the stage of a separation device according to the present embodiment, and the separation device was switched on so as to perform a separation test. When the separation device was switched on so as to start the separation test, individual pellicle frame support pins 21 fed back the separation forces of load cells 23 so as to be independently raised and lowered, and thus forces applied to the pellicle sticky agent were lessened. Although the substrate after the separation was visually observed, a remarkable separation residue was not confirmed. The maximum separation strength when the pellicle was separated was 8.5 N.

Example 2

A pellicle completed by the same procedure as in example 1 was stuck to the same 6025 mask substrate as in example 1 and was left at room temperature for 7 days. After 7 days, the mask substrate to which the pellicle described above was stuck was set on the separation device described above. Here, a separation test was performed while the control of the separation device was being performed by collectively controlling two pellicle frame support pins 21 inserted into the jig holes of the same side on each of the sides. When the operation of the separation device during the separation test was observed, as compared with the case where the four pellicle frame support pins 21 were independently controlled in example 1, a separation strength was slightly increased. However, although the substrate after the separation was visually checked, a remarkable separation residue was not confirmed. The maximum separation strength when the pellicle was separated was 10.2 N.

Example 3

A pellicle completed by the same procedure as in example 1 was stuck to the same 6025 mask substrate as in example 1 and was left at room temperature for 7 days. After 7 days, the mask substrate to which the pellicle described above was stuck was set on the separation device described above. Here, separation was performed while the control of the separation device was being performed by collectively controlling pellicle frame support pins inserted into jig holes. As compared with the case where the four pellicle frame support pins 21 were independently controlled and the separation was performed in example 1 and the case where the control was performed on each of the sides opposite each other and the separation was performed in example 2, a separation strength was slightly increased. However, although the substrate after the separation was visually checked, a remarkable separation residue was not confirmed. The maximum separation strength when the pellicle was separated was 12.3 N.

Comparative Example 1

A pellicle completed by the same procedure as in examples 1 to 3 was stuck to a mask substrate and was left for 7 days, after 7 days, the mask substrate to which the pellicle was stuck was set on the separation device described above, computer control for minimizing the measurement values of load cells was turned off, four pellicle frame support pins 21 were simultaneously raised with four single axis robots 24 at a predetermined speed and a separation test was performed. Although a separation speed was set to the same speed as a separation start speed in examples 1 to 3, and separation was performed, the maximum separation strength when the pellicle was separated was significantly high as compared with examples 1 to 3 so as to be 42.7 N, and a separation sound was produced several times at the time of separation. When the substrate after the separation was visually checked, a separation residue was confirmed in the vicinity of the part where the separation was first started.

Comparative Example 2

A pellicle completed by the same procedure as in examples 1 to 3 and comparative example 1 was stuck and was left for 7 days, after 7 days, a mask substrate to which the pellicle was stuck was set on a separation device, computer control for minimizing the measurement values of load cells was turned off, four pellicle frame support pins 21 were simultaneously raised with four single axis robots 24 at a predetermined speed and a separation test was performed. Although a separation speed was set to half a separation start speed in examples 1 to 3, that is, 0.05 mm/second, and separation was performed, the maximum separation strength was 29.5 N, and a separation sound was produced once at the time of separation. When the substrate after the separation was visually checked, a slight separation residue was confirmed in the vicinity of the part where the separation was first started.

[Supplemental Information]

The separation start speed in examples 1 to 3 described above was set to 0.1 mm/second in the upward direction of the mask substrate, and the operation was performed. Then, the computer control in which programs were set so as to minimize the measurement values of load cells was performed, and thus the four pellicle frame support pins 21 were individually raised such that the maximum separation speed was prevented from exceeding 0.1 mm/second or the operations thereof were stopped or reversed, with the result that a load caused by the separation force on the adhesive layer was reduced. On the other hand, in comparative example 1, the four pellicle frame support pins 21 were operated at a constant speed of 0.1 mm/second from the start of the separation operation to the completion thereof. In comparative example 2, the four pellicle frame support pins 21 were operated at a constant speed of 0.05 mm/second from the start of the separation to the completion thereof.

As described above, according to the present invention, the sensation which is sensed by the skilled operator described above is quantitatively grasped with the load cells provided in the individual pellicle frame support pins, data is acquired with the computer, the operations of the individual single axis robots are controlled and the movements of the individual pellicle frame support pins can be controlled so as to minimize the separation forces, with the result that the present invention is useful for a method of separating the pellicle and a device for separating the pellicle.

EXPLANATION OF REFERENCE NUMERALS

1: exposure original plate
10: pellicle
11: pellicle frame
12: pellicle film
13: pellicle film adhesive
14: adhesive layer
20: device for separating pellicle
21: pellicle frame support pin
22: pin support shaft
23: load cell
24: single axis robot
25: servo motor
26: pinion
27: rack
30: jig hole Scopes of what is claimed:

1. A method of separating, from an exposure original plate, a pellicle which includes a pellicle film that is provided in a tensioned state on a first end surface of a pellicle frame through a pellicle film adhesive and an adhesive layer that is provided on a second end surface and in which the adhesive layer is adhered to the exposure original plate, wherein a pellicle frame support pin is inserted into a jig hole provided in an outer surface of the pellicle frame, the pellicle frame support pin is moved in a direction in which the pellicle is separated from the exposure original plate, a separation force applied by the movement to the pellicle frame support pin is measured and the pellicle is separated from the exposure original plate while control is being performed such that the separation force is minimized, and wherein the measurement and the control of the separation force applied to a pellicle frame support pin inserted into a jig hole in the outer surface of the pellicle frame are independently performed on each support pin of the pellicle frame.

2. The method of separating the pellicle according to claim 1, wherein when the control of the separation force is performed, the pellicle is separated while the pellicle frame support pin is being made to perform an operation that is different from the operation in which the pellicle is separated.

3. The method of separating the pellicle according to claim 1, wherein the control of the separation force is made by adjusting the speed or direction of the moving of the pellicle frame support pin.

4. A method comprising:
separating the pellicle according to the method of claim 1, and
striking a new pellicle to a pattern surface of the exposure original plate after washing the exposure original plate.

5. The method of claim 4, wherein when the control of the separation force is performed, the pellicle is separated while the pellicle frame support pin is being made to perform an operation that is different from the operation in which the pellicle is separated.

6. The method of claim 4, wherein the control of the separation force is made by adjusting the speed or direction of the moving of the pellicle frame support pin.

7. A method of manufacturing an exposure original plate with pellicle comprising:
separating the pellicle according to the method of claim 1, and
striking a new pellicle to a pattern surface of the exposure original plate after washing the exposure original plate.

8. The method of claim 7, wherein when the control of the separation force is performed, the pellicle is separated while the pellicle frame support pin is being made to perform an operation that is different from the operation in which the pellicle is separated.

9. The method of claim 7, wherein the control of the separation force is made by adjusting the speed or direction of the moving of the pellicle frame support pin.

10. A device for separating, from an exposure original plate, a pellicle which includes a pellicle film that is provided in a tensioned state on a first end surface of a pellicle frame through a pellicle film adhesive and an adhesive layer that is provided on a second end surface and in which the adhesive layer is adhered to the exposure original plate, the device comprising:
a plurality of pellicle frame support pins which are inserted into jig holes provided in an outer surface of the pellicle frame so as to support the pellicle frame;
a plurality of load cells are provided which measure forces applied to the pellicle frame support pins; and
a plurality of single axis robots are provided which independently move the pellicle frame support pins in an up and down direction,
wherein number of pellicle frame support pins, load cells, and single axis robots are the same, and
wherein the measurement and the control of the separation force applied to a pellicle frame support pin inserted into a jig hole in the outer surface of the pellicle frame are independently performed on each support pin of the pellicle frame.

* * * * *